US009508457B2

(12) United States Patent
Bae et al.

(10) Patent No.: US 9,508,457 B2
(45) Date of Patent: *Nov. 29, 2016

(54) ELECTRONIC DEVICE AND METHOD FOR OPERATING ELECTRONIC DEVICE

(71) Applicant: SK hynix Inc., Icheon-Si (KR)

(72) Inventors: Ji-Hyae Bae, Icheon-Si (KR); Dong-Keun Kim, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/996,701

(22) Filed: Jan. 15, 2016

(65) Prior Publication Data
US 2016/0133343 A1 May 12, 2016

Related U.S. Application Data

(63) Continuation of application No. 14/809,082, filed on Jul. 24, 2015, now Pat. No. 9,240,251, which is a continuation of application No. 14/192,797, filed on Feb. 27, 2014, now Pat. No. 9,093,181.

(30) Foreign Application Priority Data

Feb. 28, 2013 (KR) ........................ 10-2013-0022234

(51) Int. Cl.
G11C 29/00 (2006.01)
G11C 13/00 (2006.01)
G11C 29/44 (2006.01)
G11C 7/10 (2006.01)
G11C 11/16 (2006.01)

(52) U.S. Cl.
CPC ............. *G11C 29/78* (2013.01); *G11C 7/1039* (2013.01); *G11C 13/003* (2013.01); *G11C 13/0069* (2013.01); *G11C 29/44* (2013.01); *G11C 29/76* (2013.01); *G11C 29/808* (2013.01); *G11C 11/16* (2013.01); *G11C 2029/4402* (2013.01)

(58) Field of Classification Search
CPC ............ G11C 29/785; G11C 29/4401; G11C 2029/4402; G11C 29/02; G11C 29/81; G11C 29/021
See application file for complete search history.

(56) References Cited

U.S. PATENT DOCUMENTS 4,598,388 A 7/1986 Anderson
6,937,533 B2 8/2005 Hojo et al.
(Continued)

FOREIGN PATENT DOCUMENTS

KR 10-2003-0028595 4/2003

*Primary Examiner* — Hien Nguyen
(74) *Attorney, Agent, or Firm* — Perkins Coie LLP

(57) ABSTRACT

An electronic device comprising a semiconductor memory unit that may include a plurality of data transfer lines; a plurality of columns including a plurality of memory cells; at least one redundancy column including a plurality of redundancy memory cells and configured to replace at least one column among the plurality of columns; a repair select information generation unit configured to store a column address of the at least one column to be replaced among the plurality of columns and generate a plurality of repair select information in response to the stored column address; and a plurality of repair selection units connected with data transfer lines corresponding to them among the plurality of data transfer lines, columns corresponding to them among the plurality of columns and the at least one redundancy column, and each configured to electrically connect a column selected among a column corresponding to it and the at least one redundancy column, to a data transfer line corresponding to it, in response to repair select information corresponding to it among the plurality of repair select information.

20 Claims, 10 Drawing Sheets

(56) References Cited

U.S. PATENT DOCUMENTS

| | | |
|---|---|---|
| 7,330,383 B2 | 2/2008 | Takai |
| 7,782,687 B2 | 8/2010 | Kurozumi |
| 7,830,710 B2 | 11/2010 | Kurozumi et al. |
| 8,743,637 B2 | 6/2014 | Matsuo |
| 8,751,885 B2 | 6/2014 | You |
| 9,093,181 B2 * | 7/2015 | Bae ................ G11C 29/44 |

* cited by examiner

ELECTRONIC DEVICE AND METHOD FOR OPERATING ELECTRONIC DEVICE

CROSS-REFERENCE TO RELATED APPLICATIONS

This present application is a continuation of, and claims priority and benefits of, U.S. patent application Ser. No. 14/809,082, published as US 2015/0332791, entitled "ELECTRONIC DEVICE AND METHOD FOR OPERATING ELECTRONIC DEVICE," and filed on Jul. 24, 2015, which is a continuation of, and claims priority and benefits of, U.S. patent application Ser. No. 14/192,797, published as US 2014/0241043, entitled "ELECTRONIC DEVICE AND METHOD FOR OPERATING ELECTRONIC DEVICE," and filed on Feb. 27, 2014, which further claims priority of Korean Patent Application No. 10-2013-00022234, entitled "SEMICONDUCTOR DEVICE, PROCESSOR, SYSTEM AND METHOD FOR OPERATING SEMICONDUCTOR DEVICE," and filed on Feb. 28, 2013. The contents of the before-mentioned patent applications are incorporated herein by reference in their entirety as part of the disclosure of this document.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research and development for such semiconductor devices have been conducted. Examples of such semiconductor devices include semiconductor devices which can store data using a characteristic switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which the speed and the efficiency of a repair operation are improved.

Also, various embodiments are directed to a semiconductor device which can perform an operation of correcting an error of read data without being inputted with a column address.

In one aspect, an electronic device including a semiconductor memory unit is provided to include: a plurality of data transfer lines; a plurality of columns including a plurality of memory cells; at least one redundancy column including a plurality of redundancy memory cells and configured to replace at least one column among the plurality of columns; a repair select information generation unit configured to store a column address of the at least one column to be replaced among the plurality of columns and generate a plurality of repair select information in response to the stored column address; and a plurality of repair selection units connected with data transfer lines corresponding to them among the plurality of data transfer lines, columns corresponding to them among the plurality of columns and the at least one redundancy column, and each configured to electrically connect a column selected among a column corresponding to it and the at least one redundancy column, to a data transfer line corresponding to it, in response to repair select information corresponding to it among the plurality of repair select information.

In some implementations, each of the repair selection units electrically connects a column and a data transfer line which correspond to it, in the case where the column corresponding to it is not replaced, and electrically connects one redundancy column of the at least one redundancy column and a data transfer line which corresponds to it, in the case where the column corresponding to it is replaced.

In some implementations, the electronic device may further include: a plurality of data input/output lines; a plurality of word lines connected with memory cells included in the same rows among the plurality of memory cells of the plurality of columns and the plurality of redundancy memory cells of the at least one redundancy column; and a plurality of buffers configured to buffer data of data input/output lines corresponding to them among the plurality of data input/output lines and transfer the buffered data to data transfer lines corresponding to them among the plurality of data transfer lines, or buffer data of data transfer lines corresponding to them among the plurality of data transfer lines and transfer the buffered data to data input/output lines corresponding to them among the plurality of data input/output lines.

In some implementations, in a read operation, data of memory cells connected to a word line selected among the plurality of word lines are stored in the plurality of buffers through the plurality of data transfer lines, and data stored in a buffer selected among the plurality of buffers is transferred to the data input/output lines.

In some implementations, in a write operation, data stored in a buffer selected among the plurality of buffers is updated with data of the data input/output lines, and data stored in the plurality of buffers are stored in memory cells which are connected to a word line selected among the plurality of word lines, through the plurality of data transfer lines.

In some implementations, the repair select information generation unit may include: a fail address storing unit configured to store the column address of the at least one column to be replaced; and an information generating unit configured to generate the plurality of repair select information in response to the column address stored in the fail address storing unit.

In some implementations, each of the plurality of memory cells may include: a select transistor configured to be turned on when a memory cell corresponding to it is selected; and a variable resistance element configured to be determined in a resistance value thereof according to a value of data stored therein, and wherein the variable resistance element comprises at least one among a metal oxide, a phase change substance and a structure in which a tunnel barrier layer is interposed between two ferromagnetic layers.

In another aspect, an electronic device comprising a semiconductor memory unit is provided to include: a plurality of data transfer lines; a plurality of columns including a plurality of memory cells; at least one redundancy column including a plurality of redundancy memory cells and configured to replace at least one column among the plurality of columns; a repair select information generation unit configured to store a column address of the at least one column to be replaced among the plurality of columns and generate a plurality of repair select information in response to the stored column address; a plurality of repair selection units connected with data transfer lines corresponding to them among the plurality of data transfer lines, columns corresponding to them among the plurality of columns and the at least one redundancy column, and each configured to electrically connect a column selected among a column corresponding to it and the at least one redundancy column, to a data transfer line corresponding to it, in response to repair select information corresponding to it among the plurality of repair select information; and an error correction unit configured to correct errors of data of a part or all of the plurality of data transfer lines.

In some implementations, each of the repair selection units electrically connects a column and a data transfer line which correspond to it, in the case where the column corresponding to it is not replaced, and electrically connects one redundancy column of the at least one redundancy column and a data transfer line which corresponds to it, in the case where the column corresponding to it is replaced.

In some implementations, the electronic device may further include: a plurality of data input/output lines; a plurality of word lines connected with memory cells included in the same rows among the plurality of memory cells of the plurality of columns and the plurality of redundancy memory cells of the at least one redundancy column; and a plurality of buffers configured to buffer data of data input/output lines corresponding to them among the plurality of data input/output lines and transfer the buffered data to the error correction unit, or buffer data generated by the error correction unit and transfer the buffered data to data input/output lines corresponding to them among the plurality of data input/output lines.

In some implementations, in a read operation, data of memory cells which are connected to a word line selected among the plurality of word lines are transferred to the error correction unit through the plurality of data transfer lines, the error correction unit receives data of the plurality of data transfer lines and generates decoding data by performing error correction decoding, the decoding data are stored in the plurality of buffers, and data stored in a buffer selected among the plurality of buffers is transferred to the plurality of data input/output lines.

In some implementations, in a write operation, data stored in a buffer selected among the plurality of buffers is updated by data of the data input/output lines, the error correction unit receives data stored in the plurality of buffers and generates encoding data by performing error correction encoding, and the encoding data are stored in memory cells which are connected to a word line selected among the plurality of word lines, through the plurality of data transfer lines.

In some implementations, the repair select information generation unit may include: a fail address storing unit configured to store the column address of the at least one column to be replaced; and an information generating unit configured to generate the plurality of repair select information in response to the column address stored in the fail address storing unit.

In some implementations, each of the plurality of memory cells may include: a select transistor configured to be turned on when a memory cell corresponding to it is selected; and a variable resistance element configured to be determined in a resistance value thereof according to a value of data stored therein, and wherein the variable resistance element comprises at least one among a metal oxide, a phase change substance and a structure in which a tunnel barrier layer is interposed between two ferromagnetic layers.

In another aspect, a method for operating an electronic device including a plurality of data transfer lines, a plurality of columns which include a plurality of memory cells, and at least one redundancy column which includes a plurality of redundancy memory cells and replaces at least one column among the plurality of columns is provided. The method may include: electrically connecting each of the plurality of data transfer lines with a column selected among the plurality of columns and the at least one redundancy column, in response to an address of at least one column to be replaced among the plurality of columns; and accessing data to memory cells included in columns which are electrically connected with the plurality of data transfer lines, among the plurality of columns and the at least one redundancy column.

In some implementations, the electronic device may further include: a plurality of data input/output lines; a plurality of word lines connected with memory cells included in the same rows among the plurality of memory cells of the plurality of columns and the plurality of redundancy memory cells of the at least one redundancy column; and a plurality of buffers configured to buffer data of data input/output lines corresponding to them among the plurality of data input/output lines and transfer the buffered data to data transfer lines corresponding to them among the plurality of data transfer lines, or buffer data of data transfer lines corresponding to them among the plurality of data transfer lines and transfer the buffered data to data input/output lines corresponding to them among the plurality of data input/output lines.

In some implementations, the accessing of the data may include in a read operation: transferring data of memory cells which are connected to a word line selected among the plurality of word lines, to the plurality of data transfer lines; storing data of the plurality of data transfer lines in the plurality of buffers; and transferring data stored in a buffer selected among the plurality of buffers, to the data input/output lines.

In some implementations, the accessing of the data may include in a write operation: updating data stored in a buffer selected among the plurality of buffers, with data of the data input/output lines; transferring data stored in the plurality of buffers to the plurality of data transfer lines; and writing data of the plurality of data transfer lines to memory cells which are connected to a word line selected among a plurality of word lines.

In some implementations, the accessing of the data may include in a read operation: transferring data of memory cells which are connected to a word line selected among the plurality of word lines, to the plurality of data transfer lines; performing error correction decoding for data of the plurality of data transfer lines and generating decoding data; storing the decoding data in the plurality of buffers; and transferring data stored in a buffer selected among the plurality of buffers, to the data input/output lines.

In some implementations, the accessing of the data may include in a write operation: updating data stored in a buffer selected among the plurality of buffers, with data of the data input/output lines; performing error correction encoding for data stored in the plurality of buffers and generating encoding data; transferring the encoding data to the plurality of data transfer lines; and writing data of the plurality of data transfer lines to memory cells which are connected to a word line selected among a plurality of word lines.

In some implementations, each of the plurality of memory cells may include: a select transistor configured to be turned on when a memory cell corresponding to it is selected; and a variable resistance element configured to be determined in a resistance value thereof according to a value of data stored therein, and wherein the variable resistance element comprises at least one among a metal oxide, a phase change substance and a structure in which a tunnel barrier layer is interposed between two ferromagnetic layers.

In another aspect, a microprocessor is provided to include: a control unit configured to receive a signal including a command from an outside, and performs extraction, decoding and controlling input and output of the command; an operation unit configured to perform an operation according to a result that the control unit decodes the command; and a memory unit configured to store at least one of data for performing the operation, data corresponding to a result of performing the operation, and an address of data for which the operation is performed. The memory unit may include: a plurality of data transfer lines; a plurality of columns including a plurality of memory cells; at least one redundancy column including a plurality of redundancy memory cells and configured to replace at least one column among the plurality of columns; a repair select information generation unit configured to store a column address of the at least one column to be replaced among the plurality of columns and generate a plurality of repair select information in response to the stored column address; and a plurality of repair selection units connected with data transfer lines corresponding to them among the plurality of data transfer lines, columns corresponding to them among the plurality of columns and the at least one redundancy column, and each configured to electrically connect a column selected among a column corresponding to it and the at least one redundancy column, to a data transfer line corresponding to it, in response to repair select information corresponding to it among the plurality of repair select information.

In another aspect, a processor is provided to include: a core unit configured to perform, according to a command inputted from an outside, an operation corresponding to the command, by using data; a cache memory unit configured to store at least one of data for performing the operation, data corresponding to a result of performing the operation, and an address of data for which the operation is performed; and a bus interface connected between the core unit and the cache memory unit, and configured to transmit data between the core unit and the cache memory unit. The cache memory unit may include: a plurality of data transfer lines; a plurality of columns including a plurality of memory cells; at least one redundancy column including a plurality of redundancy memory cells and configured to replace at least one column among the plurality of columns; a repair select information generation unit configured to store a column address of the at least one column to be replaced among the plurality of columns and generate a plurality of repair select information in response to the stored column address; and a plurality of repair selection units connected with data transfer lines corresponding to them among the plurality of data transfer lines, columns corresponding to them among the plurality of columns and the at least one redundancy column, and each configured to electrically connect a column selected among a column corresponding to it and the at least one redundancy column, to a data transfer line corresponding to it, in response to repair select information corresponding to it among the plurality of repair select information.

In another aspect, a system is provided to comprise: a processor configured to decode a command inputted from an outside and control an operation for information according to a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside. At least one of the auxiliary memory device and the main memory device may include: a plurality of data transfer lines; a plurality of columns including a plurality of memory cells; at least one redundancy column including a plurality of redundancy memory cells and configured to replace at least one column among the plurality of columns; a repair select information generation unit configured to store a column address of the at least one column to be replaced among the plurality of columns and generate a plurality of repair select information in response to the stored column address; and a plurality of repair selection units connected with data transfer lines corresponding to them among the plurality of data transfer lines, columns corresponding to them among the plurality of columns and the at least one redundancy column, and each configured to electrically connect a column selected among a column corresponding to it and the at least one redundancy column, to a data transfer line corresponding to it, in response to repair select information corresponding to it among the plurality of repair select information.

In another aspect, a data storage system is provided to include: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside. At least one of the storage device and the temporary storage device may include: a plurality of data transfer lines; a plurality of columns including a plurality of memory cells; at least one redundancy column including a plurality of redundancy memory cells and configured to replace at least one column among the plurality of columns; a repair select information generation unit configured to store a column address of the at least one column to be replaced among the plurality of columns and generate a plurality of repair select information in response to the stored column address; and a plurality of repair selection units connected with data transfer lines corresponding to them among the plurality of data transfer lines, columns corresponding to them among the plurality of columns and the at least one redundancy column, and each configured to electrically connect a column selected among a column corresponding to it and the at least one redundancy column, to a data transfer line corresponding to it, in response to repair select information corresponding to it among the plurality of repair select information.

In another aspect, a memory system is provided to include: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside. At least one of the memory and the buffer memory may include: a plurality of data transfer lines; a plurality of columns including a plurality of memory cells; at least one redundancy column including a plurality of redundancy memory cells and configured to replace at least one column among the plurality of columns; a repair select information generation unit configured to store a column address of the at least one column to be replaced among the plurality of columns and generate a plurality of repair select information in response to the stored column address; and a plurality of repair selection units connected with data transfer lines corresponding to them among the plurality of data transfer lines, columns corresponding to them among the plurality of columns and the at least one redundancy column, and each configured to electrically connect a column selected among a column corresponding to it and the at least one redundancy column, to a data transfer line corresponding to it, in response to repair select information corresponding to it among the plurality of repair select information.

In another aspect, an electronic device comprising a semiconductor memory unit is provided to include: a plurality of data transfer lines; a plurality of columns each column including a plurality of memory cells; one or more redundancy columns each including a plurality of redundancy memory cells for replacing a column of memory cells when the column fails to operate properly; a repair select information generation unit configured to store a column address of a column to be replaced among the plurality of columns and generate a plurality of repair select information in response to the stored column address; and a plurality of repair selection units coupled to the plurality of columns, respectively and coupled to a redundancy column, each repair selection unit selectively providing an electrical connection to a corresponding column or the redundancy column based on the repair select information.

In some implementations, the electronic device may further include: a plurality of data input/output lines receiving data to be stored in a selected memory cell from an outside or outputting data read from a selected memory cell to an outside.

In some implementations, the electronic device may further include: a plurality of buffers coupled to the repair selection units, respectively, and operable to buffer input data to the columns and to buffer data from the columns.

In some implementations, the repair select information generation unit may include: a fail address storing unit storing the column address of the particular column; and an information generating unit generating repair select information for each column such that repair select information generated for the particular column is distinguished from repair select information generated for a column that is not to be replaced.

In some implementations, each repair selection unit provides the electrical connection to a corresponding column if the corresponding column is not to be replaced or to a redundancy column if the corresponding column is to be replaced.

In some implementations, the electronic device may further include: a plurality of word lines, each word line coupled to memory cells and a redundancy memory cells that are arranged in the same row; and a row control unit selecting a particular word line using a row address among the plurality of word lines.

In some implementations, each of the plurality of memory cells comprises: a select transistor connected to a corresponding memory cell; and a variable resistance element of which resistance value is determined according to a value of data stored therein.

In some implementations, the electronic device may further include: an error correction unit correcting errors that occur in a write or read operation.

In some implementations, the error correction unit receives data from the plurality of data transfer lines and performs error correction decoding to generate decoded data.

In some implementations, the error correction unit receives data transferred from outside and performs error correction encoding to generate encoded data.

In some implementations, each column may include: a source line and a bit line that are connected to both ends of the plurality of memory cells; a write circuit providing current to a selected memory circuit in a write operation; and a read circuit providing current to a selected memory circuit in a read operation.

In yet another aspect, a method for operating an electronic device is provided to include: providing a redundancy column including memory cells and a plurality of columns, each column including memory cells and having an one-to-one relation with a plurality of data transfer lines; and generating information on each column which identifies a particular column to be replaced; and electrically connecting each data transfer line to a corresponding column that is not to be replaced or the redundancy column instead of the particular column.

In some implementations, the method may further include: accessing to memory cells in columns and the redundancy column which are electrically connected with data transfer lines.

In some implementations, the accessing of the data may include: activating a word line; and transferring data stored in memory cells which are connected to the activated word line to the plurality of data transfer lines. The accessing of the data may include: activating a word line; and writing data to be stored in memory cells which are connected to the activated word line.

In some implementations, the accessing of the data may further include after the transferring of the data: performing error correction decoding for data transferred to the plurality of data transfer lines to generate decoded data.

In some implementations, the accessing of the data may further include before the writing of the data: performing error correction encoding for data to be stored to generate encoded data.

In some implementations, each of the plurality of memory cells may include: a select transistor connected to a corresponding memory cell; and a variable resistance element of which resistance value is determined according to a value of data stored therein.

In some implementations, the generating of information may include: using pre-stored information on the column address of the particular column.

In some implementations, the electronic device may further include a microprocessor which may include: a control unit that is configured to receive a signal including a command from an outside of the microprocessor, and performs extracting, decoding of the command, or controlling input or output of a signal of microprocessor; and an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is part of the memory unit in the microprocessor.

In some implementations, the electronic device may further include a processor which may include: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is part of the cache memory unit in the processor.

In some implementations, the electronic device may further include a processing system which may include: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the variable resistance element is part of the auxiliary memory device or the main memory device in the processing system.

In some implementations, the electronic device may further include a data storage system which may include: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is part of the storage device or the temporary storage device in the data storage system.

In some implementations, the electronic device may further include a memory system which may include: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance element is part of the memory or the buffer memory in the memory system.

The disclosed technology may be used to achieve one or more advantages. For example, since a repair operation is performed without the comparison between an inputted address and a fail address, the speed and the efficiency of the repair operation may be improved. For another example, it is possible to use the disclosed technology to correct an error of read data without a column address.

Those and other aspects of the disclosed technology and their implementations and variations are described in greater detail in the drawings, the description and the claims.

DETAILED DESCRIPTION

Various examples and implementations of the disclosed technology are described below in detail with reference to the accompanying drawings.

A semiconductor device in accordance with the present implementations may include a variable resistance element. The variable resistance element may exhibit a variable resistance characteristic, and include a single layer or multilayer. For example, the variable resistance element may include a material used in RRAM, PRAM, MRAM, FRAM and the like, such as a chalcogenide-based compound, a transition metal compound, a ferroelectric material, or a ferromagnetic material. However, other implementations are possible as long as the variable resistance element has a variable resistance characteristic of switching between different resistance states depending on a voltage or current applied across the variable resistance element.

More specifically, the variable resistance element may include metal oxide. The metal oxide may include a transition metal oxide such as nickel oxide, titanium oxide, hafnium oxide, zirconium oxide, tungsten oxide, or cobalt oxide and a perovskite-based material such as STO (SrTiO) or PCMO (PrCaMnO). Such a variable resistance element may exhibit a characteristic of switching between different resistance states through formation/disappearance of a current filament caused by behavior of vacancies.

Furthermore, the variable resistance element may include a phase change material. The phase change material may include a chalcogenide-based material such as GST (Ge—Sb—Te), for example. The variable resistance element is stabilized to any one of a crystalline state and an amorphous state by heat, thereby switching between different resistance states.

Furthermore, the variable resistance element may include a structure having a tunnel barrier layer interposed between two magnetic layers. The magnetic layer may be formed of NiFeCo or CoFe, and the tunnel barrier layer may be formed of $Al_2O_3$. The variable resistance element may exhibit a characteristic of switching between different resistance states according to the magnetization direction of the magnetic layer. For example, the variable resistance element may have a low-resistance state when the magnetization directions of the two magnetic layers are parallel to each other, and may have a high-resistance state when the magnetization directions of the two magnetic layers are anti-parallel to each other.

Figure 1:
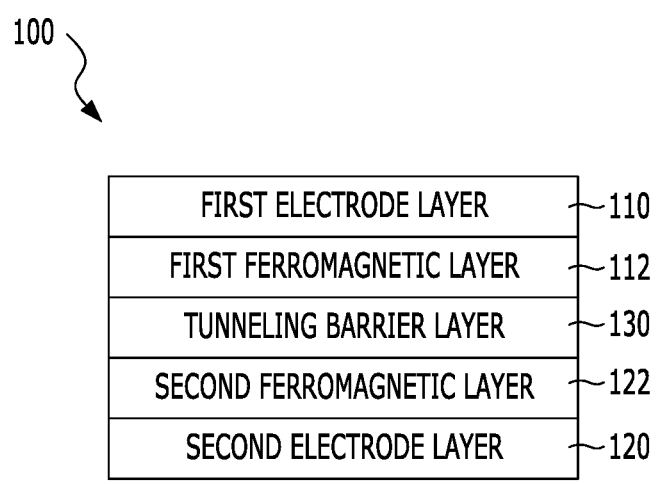
FIG. 1 is a diagram showing an example of a magnetic tunnel junction (MTJ) element including a tunneling barrier layer interposed between two ferromagnetic layers.

FIG. 1 is a diagram illustrating an implementation of a magnetic tunnel junction (MTJ) element including a tunnel barrier layer interposed between two magnetic layers.

As illustrated in FIG. 1, the MTJ element 100 includes a first electrode layer 110 serving as a top electrode, a second electrode layer 120 serving as a bottom electrode, a pair of first and second magnetic layers 112 and 122, and a tunnel barrier layer 130 formed between the pair of magnetic layers 112 and 122.

The first magnetic layer 112 may include a free ferromagnetic layer of which the magnetization direction is varied according to the direction of a current applied to the MTJ element 100, and the second magnetic layer 122 may include a pinned ferromagnetic layer of which the magnetization direction is pinned.

The MTJ element 100 operates to store data "0" or "1" as the resistance value is changed to a low value or a high value, respectively, according to the direction of the current.

Figure 2A:
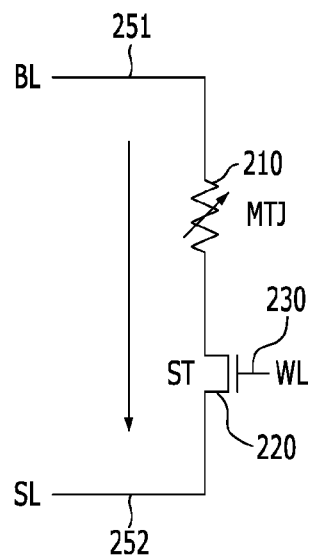
FIGS. 2A and 2B are views explaining a principle of storing data in a resistance variable element.
Figure 2B:
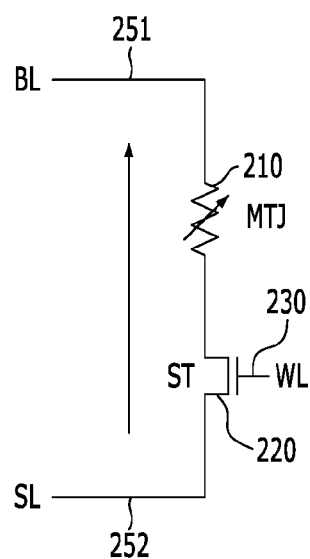

FIGS. 2A and 2B are diagrams of two examples of circuit operation configurations where a variable resistance element 210 exhibits two different resistance values for explaining how data is stored in a variable resistance element 210. The variable resistance element 210 may include the MTJ element 100 described with reference to FIG. 1.

FIG. 2A is a diagram for explaining the principle that a low data is stored in the variable resistance element 210. In order to select the variable resistance element 210 for storing data is intended to be stored, a word line 230 coupled to the variable resistance element 210 is activated to turn on a transistor 220. Consider the situation where a current flows from one end 251 toward the other end 252, that is, from the first electrode layer 110 as the top electrode to the second electrode layer 120 as the bottom electrode of the MTJ element 100 in FIG. 1 as indicated by the arrow direction. In this case, the magnetization direction of the first magnetic layer 110 as the free magnetic layer becomes parallel to the magnetization direction of the second magnetic layer 122 as the pinned magnetic layer, and the variable resistance element 210 has a low resistance state. When the variable resistance element 210 has a low resistance state, it is defined that low data is stored in the variable resistance element 210.

FIG. 2B is a diagram for explaining the principle that a high data value is stored in the variable resistance element 210. The word line 230 coupled to the variable resistance element 210 is activated to turn on the transistor 220. When a current flows from one end 252 to the other end 251, that is, from the second electrode layer 120 to the first electrode layer 110 as indicated by the arrow direction, the magnetization direction of the first magnetic layer 112 becomes anti-parallel to the magnetization direction of the second magnetic layer 122, and the variable resistance element 210 has a high resistance state. Under this condition, the variable resistance element 210 has a high resistance state, which represents that high data is stored in the variable resistance element 210.

The above variable resistance element can be used to form an array of memory cells in a semiconductor device. In operation, one or more memory cells may fail to operate properly. Such a semiconductor device may be designed to include built-in repair or redundancy mechanism to mitigate a failed memory cell.

Figure 3:
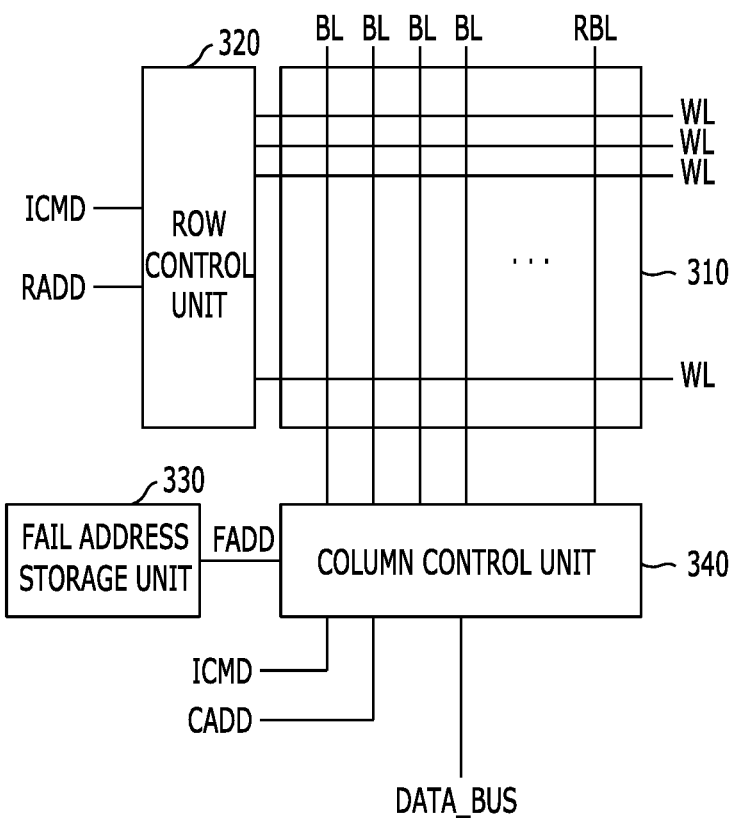
FIG. 3 shows an example of a configuration diagram of a semiconductor device in which a comparison between a column address CADD and a fail address FADD needs to be performed to complete the repair operation.

FIG. 3 shows an example of a configuration diagram of a semiconductor device in which a comparison between a column address CADD and a fail address FADD needs to be performed to complete the repair operation at a failed variable resistance.

Referring to FIG. 3, the illustrated semiconductor device includes a cell array 310, a row control unit 320, a fail address storage unit 330, a column control unit 340, and a data bus DATA_BUS.

The cell array 310 includes a plurality of memory cells arranged in an array form. The plurality of memory cells are connected with corresponding word lines and corresponding bit lines among a plurality of word lines WL and a plurality of bit lines BL and one or more redundancy bit lines RBL. A redundancy bit line RBL is a bit line for replacing a failed bit line BL if a bit line fails.

The row control unit 320 is configured to activate a word line corresponding to a row address RADD among the plurality of word lines WL in response to an internal command ICMD and the row address RADD which are internally generated when a row operation command such as an active command or a pre-charge command is inputted to the semiconductor device. The data of the memory cells which are connected to the activated word line are amplified by sense amplifiers (not shown) corresponding to respective bit lines.

A memory cell that fails a test that is performed to verify whether a memory cell is in a good condition for performing normal storage cell operations can be represented by a fail address for the failed memory cell by the corresponding word line WO and the corresponding bit line BL. The fail address storage unit 330 may store addresses (hereinafter, referred to as 'fail addresses FADD') of a word line WL and a bit line BL which failed a test and thus cannot be used. The following explains how such a semiconductor device operates when one of a plurality of bit lines BL fails to cause a failure of a corresponding memory cell connected to the failed bit line BL.

The column control unit 340 is configured to transfer the data on a selected bit line among the plurality of bit lines BL to the data bus DATA_BUS in response to the internal command ICMD and the column address CADD. The selected bit line has a column address CADD. The internal command ICMD and the column address CADD are internally generated when a column operation command such as a write command or a read command is inputted to the semiconductor device. If the column address CADD has the same address as the fail address FADD, the column control unit 340 transfers the data of the redundancy bit line RBL to the data bus DATA_BUS.

The data bus DATA_BUS transfers the data inputted through data pads (not shown) from an outside to the semiconductor device or transfers the data outputted from the cell array 310 to data pads.

In general, an operation for replacing the failed bit line BL with the redundancy bit line RBL is referred to as a repair operation. In the semiconductor device of FIG. 3, the column address CADD and the fail address FADD are compared with each other, and based on the comparison result, it is decided whether to replace the bit line BL having the column address CADD with the redundancy bit line RBL. As such, in order to complete the repair operation, the comparison between the column address CADD and the fail address FADD needs to be performed and thus, a time for the comparison is required.

Figure 4:
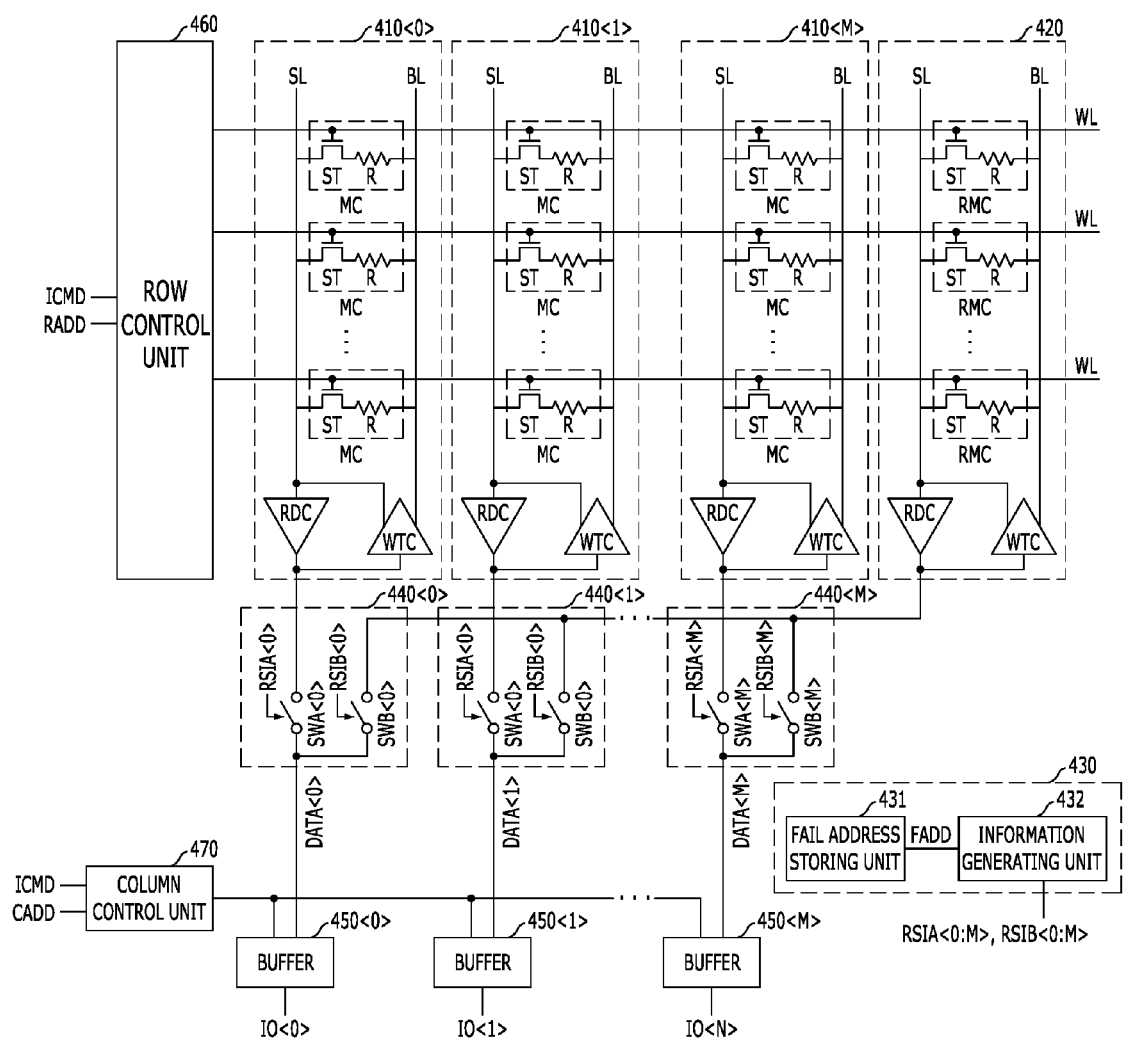
FIG. 4 shows an example of a configuration diagram of a semiconductor device.

FIG. 4 shows an example of a configuration diagram of a semiconductor device that is designed to provide a faster repair operation than the design in FIG. 3.

Referring to FIG. 4, a semiconductor device includes a plurality of data transfer lines DATA<0> to Data<M>, a plurality of columns 410<0> to 410<M> each including a plurality of memory cells MC, at least one redundancy column 420 including a plurality of redundancy memory cells RMC, a repair select information generation unit 430 and a plurality of repair selection units 440<0> to 440<M>. The redundancy column 420 is configured to replace at least one column among the plurality of columns 410<0> to 410<M>. The repair select information generation unit 430 is configured to store a column address FADD of the at least one column that needs to be replaced among the plurality of columns 410<0> to 410<M>. The repair select information generation unit 430 generate a plurality of repair select information RSIA<0> to RSIP<M> and RSIB<0> to RSIB<M> in response to the stored column address FADD. Each repair selection unit 440<0:M> is connected to a corresponding data transfer line, a corresponding columns among the plurality of columns 410<0:M>, and the at least one redundancy column 420. Each repair selection unit operates to connect a corresponding column 410<0:M> and the at least one redundancy column 420 to a corresponding data transfer line in response to corresponding repair select information RSIA <0:M> and RSIB <0:M>.

The semiconductor device further includes a plurality of data input/output lines IO<0> to IO<M>, a plurality of word lines WL, and a plurality of buffers 450<0> to 450<M>. Each word line WL is connected with memory cells and a redundancy memory cell that are arranged on the same row. Each buffer 450<0:M> is configured to buffer data of a corresponding data input/output line IO<0:M> or data of a corresponding data transfer line DATA<0:M>. Further, each buffer 450<0:M> is configured to transfer the buffered data to a corresponding data transfer line DATA<0:M> or to a corresponding data input/output line.

Each memory cell MC and each redundancy memory cell RMC include a select transistor ST and a variable resistance element R which are connected with each other. The select transistor ST is connected with a corresponding word line WL and turned on when the connected word line WL is activated. Current may flow through the variable resistance element R which is connected with the turned-on select transistor ST.

The variable resistance element R has different resistance values according to the value of the data stored therein. For example, the variable resistance element R has a first resistance value when first data is stored therein and has a second resistance value greater than the first resistance value when second data is stored therein. The resistance value of the variable resistance element R may be switched according to current flowing through the variable resistance element R.

The first data may be high data and the second data may be low data, or the first data may be low data and the second data may be high data.

Each column 410<0:M> includes a bit line BL, a source line SL, a plurality of memory cells MC which are connected between the bit line BL and the source line SL, a write circuit WTC, and a read circuit RDC. Among the plurality of memory cells MC included in each column 410<0:M>, a write or read operation may be performed for a memory cell MC (hereinafter, referred to as a 'selected memory cell') that is connected to an activated word line WL.

In the write operation, the write circuit WTC provides current to a selected memory cell MC. The direction of the current provided by the write circuit WTC is determined according to data value to be written in the selected memory cell MC. For example, if storing the first data in the selected memory cell MC, the write circuit WTC provides current flowing from the bit line BL to the source line SL. In this case, the variable resistance element R is switched to the first resistance value, and the first data is stored in the selected memory cell MC. Alternatively, if storing the second data in the selected memory cell MC, the write circuit WTC provides current flowing from the source line SL to the bit line BL. In this case, the variable resistance element R is switched to the second resistance value, and the second data is stored in the selected memory cell MC.

In the read operation, the read circuit RDC provides current or applies a voltage to a selected memory cell MC, and the resistance value of the selected memory cell MC is discriminated by measuring the voltage of both ends of the selected memory cell MC or measuring the current flowing through the selected memory cell MC. Since the resistance value of the selected memory cell MC is determined according to data value stored therein, the resistance value discriminated becomes the data value stored in the selected memory cell MC.

The configuration of the at least one redundancy column 420 is the same as the above-described configuration of the plurality of columns 410<0:M>. The redundancy column 420 is used only for replacing a column that has failed and becomes inoperable. While it is illustrated in FIG. 4 that one redundancy column 420 is included in the semiconductor device, the number of the redundancy columns included in the semiconductor devices may be varied if necessary.

In the write operation, data to be written in the memory cells MC and the redundancy memory cells RMC are transferred through the plurality of data transfer lines DATA<0:M>, and in the read operation, the data read from the memory cells MC and the redundancy memory cells RMC are transferred through the plurality of data transfer lines DATA<0:M>.

The repair select information generation unit 430 stores the fail address FADD of the at least one column that has failed a test and needs to be replaced with the at least one redundancy column 420. The repair select information generation unit 430 generates the plurality of repair select information RSIA<0:M> or RSIB<0:M> based on the stored fail address FADD. The plurality of repair select information RSIA<0:M> and RSIB<0:M> corresponds to the plurality of columns 410<0:M>, respectively. If the repair select information RSIA<0:M> is activated, columns corresponding to the repair select information RSIA<0:M> are selected. If the repair select information RSIB<0:M> is activated, the redundancy column 420 is selected instead of columns. Assuming that there exists the column 410<0> that has not failed a test and does not need to be replaced, the repair select information RSIA<0> is activated to select the column 410<0> and the repair select information RSIB<0> is deactivated. Conversely, assuming that there exists the column 410<0> that has failed a test and needs to be replaced, the repair select information RSIB<0> is activated to select the redundancy column 420 instead of the column 410<0> and the repair select information RSIA<0> is deactivated.

The repair select information generation unit 430 includes a fail address storing unit 431 and an information generating unit 432. The fail address storing unit 431 is configured to store the column address FADD of the at least one column that needs to be replaced. The information generating unit 432 is configured to generate the plurality of repair select information RSIA<0:M> or RSIB<0:M> in response to the column address FADD stored in the fail address storing unit 431. The repair select information RSIA<0:M>, RSIB<0:M> may be generated by decoding the fail address FADD. The fail address storing unit 431 may be configured using a fuse circuit, an anti-fuse circuit, a ROM, a nonvolatile memory, or the like. For normal column addresses, the information generating unit 432 activates the repair select information RSIA<0:M> and deactivates the repair select information RSIB<0:M>. However, for fail addresses FADD, the information generation unit 432 activates the repair select information RSIB<0:M> and deactivates the repair select information RSIA<0:M>. For example, if the fail address storing unit 431 informs that the fail address FADD corresponds to a column 410<K> (1≤K≤M), the information generating unit 432 activates the repair select information RSIA<0:K−1> and 'RSIA<K+1:M>, deactivates the repair select information RSIB<0:K−1> and 'RSIB<K+1:M>, activate the repair select information RSIB<K>.

The repair selection units 440<0:M> are connected respectively with columns 410<0:M> and data transfer lines DATA<0:M>. Further, the repair selection units 440<0:M> are connected with the at least one redundancy column 420. If a repair select information RSIA<0:M> is activated for a column, a corresponding repair selection unit 440<0:M> is electrically connected with the column and a corresponding data transfer line. If a repair select information RSIB<0:M> is activated for a column, a corresponding repair select unit 440<0:M> is electrically connected with the redundancy column 420 and a corresponding data transfer line.

In the example shown in FIG. 4, the repair selection units 440<0:M> are electrically connected with respective columns and respective data transfer lines if the columns have not failed and do not need to be replaced. The repair selection units 440<0:M> are electrically connected with the at least one redundancy column 420 and respective data transfer lines if the columns have failed and need to be replaced. For this operation, the respective repair selection units 440<0:M> may include two switches SWA<0:M> and SWB<0:M>. The switches SWA<0:M> enable or disable a connection between the columns 410<0:M> and the data transfer lines DATA<0:M> in response to the repair select information RSIA<0:M>. The switches SWB<0:M> enable or disable a connection between the redundancy column 420 and the data transfer lines DATA<0:M> in response to the repair select information RSIB<0:M>.

Assume that the column 410<K> among a plurality of columns 410<0:M> has failed a test and needs to be replaced. In this case, the repair select information generation unit 430 operates to activate the repair select information RSIA<0:K−1>, RSIA<K+1:M> and RSIB<K> and deactivate the repair select information RSIB<0:K−1>, RSIB<K+1:M> and RSIA<K>. In response to the repair select information, the switches SWA<0:K−1>, SWA<K+1:M> and SWB<K> are turned on, and the switches SWB<0:K−1>, SWB<K+1:M> and SWA<K> are turned off. Thus, the repair selection units 440<0:K−1> and 440<K+1:M> are connected with the corresponding columns, and the repair selection unit 440<K> is connected with the redundancy column 420. Accordingly, for the columns 410<0:K−1> and 410<K+1:M>, the corresponding repair selection units 440<0:K−1> and 440<K+1:M> are electrically connected with the corresponding data transfer lines DATA<0:K−1> and DATA<K+1:M>. For the column <k>, the redundancy column 420 is electrically connected with the data transfer line DATA<K>.

In the write operation, data to be transferred to the plurality of data transfer lines DATA<0:M> are transferred through the plurality of data input/output lines IO<0:M> from an outside. In the read operation, the data of the plurality of data transfer lines DATA<0:M> are outputted to an outside through the plurality of input/output lines IO<0:M>.

The plurality of buffers 450<0:M> respectively correspond to the plurality of data transfer lines DATA<0:M>. The buffers 450<0:M> operate to buffer the data transferred from the outside during the write operation and the data transferred from the plurality of data transfer lines DATA<0:M> during the read operation. In detail, in the write operation, a column address CADD to store data is selected among the plurality of buffers 450<0:M>. Among the plurality of buffers 450<0:M>, the buffer corresponding to the column address CADD is selected. The data stored in the selected buffer is updated with data transferred from the corresponding data input/output lines IO<0:M>. A word line is selected by a row address RADD among the plurality of word lines WL and the data stored in the plurality of buffers 450<0:M> are stored in the memory cells which are connected to the selected word line WL through the plurality of data transfer lines DATA<0:M>. In the read operation, a word line is selected by the row address RADD among the plurality of word lines WL. The data of the memory cells connected to the selected word line are transferred to the plurality of buffers 450<0:M> through the plurality of data transfer lines DATA<0:M>. A buffer is selected by a column address CADD among the plurality of buffers 450<0:M> and the data stored in the selected buffer is transferred to the data input/output lines IO<0:M>.

The semiconductor device includes a row control unit 460 and a column control unit 470. The row control unit 460 receives an internal command ICMD and a row address RADD which are internally generated in the semiconductor device in response to a row operation command and activates a word line WL corresponding to the row address RADD among the plurality of word lines WL. The column control unit 470 receives an internal command ICMD and a column address CADD which are internally generated in response to a column operation command and activates a buffer corresponding to the column address CADD among the plurality of buffers 450<0:M>.

Hereinafter, explanations will be separately made for a write operation and a read operation when assuming that the repair selection unit 440<0> electrically connects the redundancy column 420 with the data transfer line DATA<0> and that the remaining repair selection units 440<1:M> electrically connect the corresponding columns 410<1:M> with the corresponding data transfer lines DATA<1:M>.

(1) A Write Operation of the Semiconductor Device

As the semiconductor device is powered on, the repair select information generation unit 430 generates the plurality of repair select information RSIA<0:M> and RSIB<0: M> based on the stored fail address FADD. Each of the plurality of repair selection units 440<0:M> electrically connects a corresponding column or the redundancy column 420 with a corresponding data transfer line, in response to the corresponding repair select information RSIA<0:M> or the corresponding repair select information RSIB<0:M>.

A write command, the row address RADD, the column address CADD and data to write are inputted to the semiconductor device. The write command, the row address RADD, the column address CADD and the data to write may be inputted at the same time or may be inputted in a predetermined sequence according to a design. The column control unit 470 updates the data of a buffer corresponding to the column address CADD among the plurality of buffers 450<0:M>. The data of the plurality of buffers 450<0:M> are transferred to the plurality of columns 410<1:M> and the redundancy column 420 through the plurality of data transfer lines DATA<0:M>. The row control unit 460 activates a word line WL corresponding to the row address RADD, and the write circuits WTC provides current to the memory cells MC and the redundancy memory cell RMC which are connected to the activated word line WL and write data therein.

(2) A Read Operation of the Semiconductor Device

As the semiconductor device is powered on, the repair select information generation unit 430 generates the plurality of repair select information RSIA<0:M> and RSIB<0: M> based on the stored fail address FADD. Each of the plurality of repair selection units 440<0:M> electrically connects a corresponding column or the redundancy column 420 with a corresponding data transfer line, in response to the corresponding repair select information RSIA<0:M> and the corresponding repair select information RSIB<0:M>.

A read command, the row address RADD and the column address CADD are inputted to the semiconductor device. The read command, the row address RADD and the column address CADD may be inputted at the same time or may be inputted in a predetermined sequence according to a design. The row control unit 460 activates a word line WL corresponding to the row address RADD. The read circuits RDC read the data stored in the memory cells MC and the redundancy memory cell RMC which are connected to the activated word line WL. The data read from the plurality of columns 410<1:M> and the redundancy column 420 are transferred to the plurality of data transfer lines DATA<0: M>. The data of the plurality of data transfer lines DATA<0: M> are stored in the plurality of buffers 450<0:M>.

The column control unit 470 selects a buffer corresponding to the column address CADD among the plurality of buffers 450<0:M> and outputs the data stored in the selected buffer to an outside of the semiconductor device through the corresponding data input/output line IO<0:M>.

In a semiconductor device based on the disclosed technology herein, data transfer lines are electrically connected with corresponding columns or the redundancy column depending on the corresponding columns have a fail address. Through the connections between the data lines and the corresponding columns or the redundancy column, data are read from or written in the corresponding columns or the redundancy column during a read or write operation. As compared with the semiconductor device of FIG. 3, since it is not necessary to compare a column address and a fail address for a repair operation, a repair operation can be done quickly and thus, the speed of a read and write operation can increase.

Figure 5:
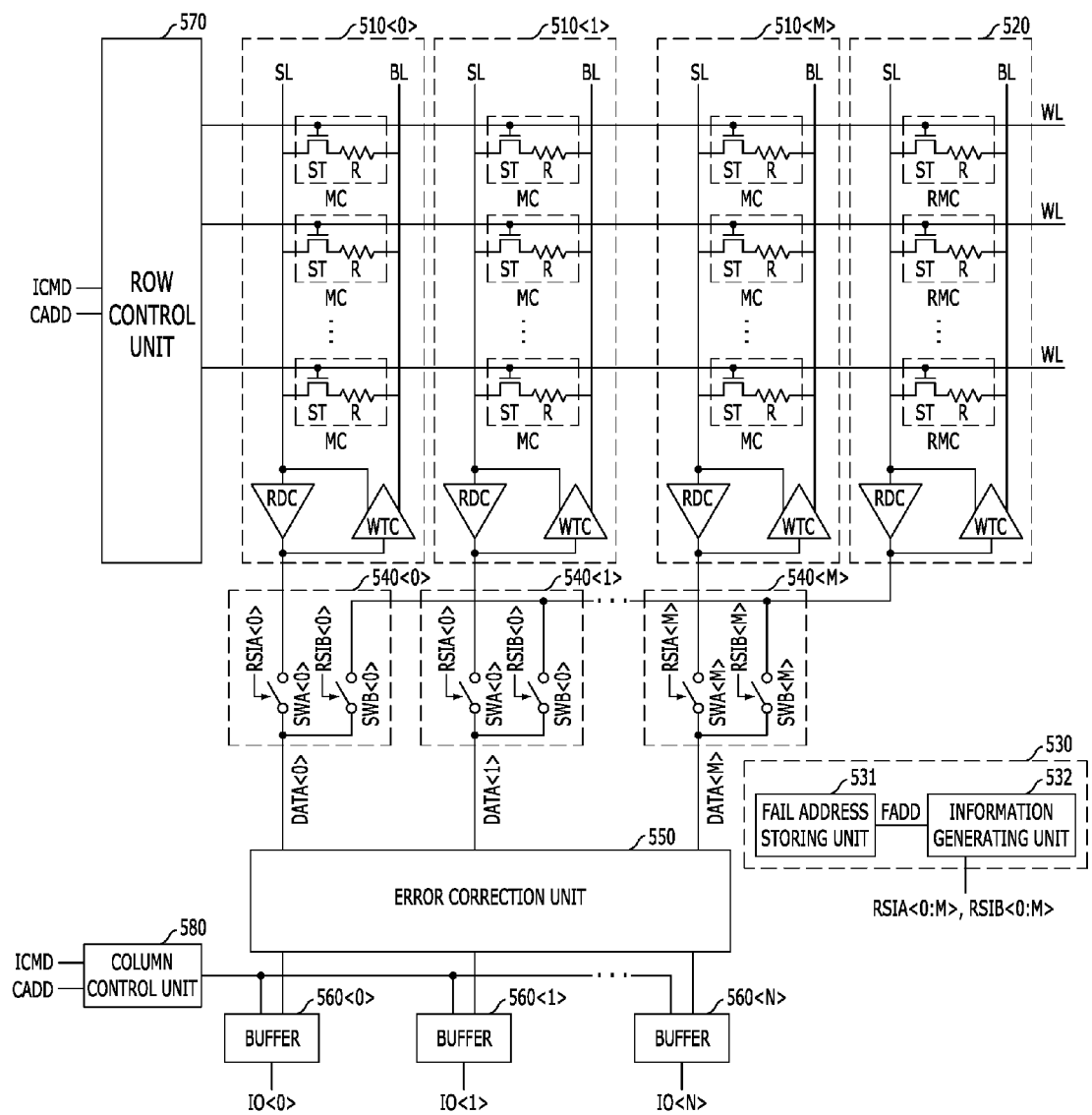
FIG. 5 shows an example of a configuration diagram of a semiconductor device.

FIG. 5 shows an example of a configuration diagram of a semiconductor device variable resistance.

Referring to FIG. 5, a semiconductor device includes a plurality of data transfer lines DATA<0:M>, a plurality of columns 510<0:M> including a plurality of memory cells MC, at least one redundancy column 520 including a plurality of redundancy memory cells RMC, and configured to replace at least one column among the plurality of columns 510<0:M>, a repair select information generation unit 530 configured to store a column address FADD of the at least one column to be replaced among the plurality of columns 510<0:M> and generate a plurality of repair select information RSIA<0:M> and RSIB<0:M> in response to the stored column address FADD, a plurality of repair selection units 540<0:M> connected with data transfer lines corresponding to them among the plurality of data transfer lines DATA<0: M>, columns corresponding to them among the plurality of columns 510<0:M> and the at least one redundancy column 520, and each configured to electrically connect a column selected among a column corresponding to it and the at least one redundancy column 520, to a data transfer line corresponding to it, in response to repair select information corresponding to it among the plurality of repair select information RSIA<0:M> and RSIB<0:M>, and an error correction unit 550 configured to correct errors of data of a part or all of the plurality of data transfer lines DATA<0:M>.

The semiconductor device further includes a plurality of data input/output lines IO<0:N>, a plurality of word lines WL each of which is connected with the memory cells and redundancy memory cells RMC arranged on the same rows, and a plurality of buffers 560<0:N> configured to buffer the data of the corresponding data input/output lines and transfer the buffered data to the error correction unit 550 or buffer the data generated by the error correction unit 550 and transfer the buffered data to the corresponding data input/output lines.

In one implementation, the configuration and operations of the semiconductor device of FIG. 5 are similar to those of the semiconductor device of FIG. 4 except that the errors of data are corrected using the error correction unit 550. For example, the configurations and operations of the memory cells MC, the redundancy memory cells RMC, the plurality of columns 510<0:M> and the redundancy column 520 are the same as those of the memory cells MC, the redundancy memory cells RMC, the plurality of columns 410<0:M> and the redundancy column 420 of FIG. 4. Hereinafter, the semiconductor device of FIG. 5 will be explained with a focus on the differences from FIG. 4.

The error correction unit 550 corrects an error to reduce the errors of data in performing a write or read operation. For example, the error correction unit 550 may perform error correction coding to correct the errors of data by using hamming codes. Other implementations are also possible such that any codes may be used so long as it is possible to correct errors of data.

In a write operation, the error correction unit 550 receives the data from the plurality of buffers 560<0:N> and encodes data by performing error correction encoding. The encoded data may include the data inputted through the plurality of data input/output lines IO<0:N> from an outside and the parity data generated to reduce the errors of the data stored upon reading.

In a read operation, the error correction unit 550 receives the data from the plurality of data transfer lines DATA<0: M> and decodes data by performing error correction decoding. The data received from the plurality of data transfer lines DATA<0:M> may include the data stored in the memory cells MC or the redundancy memory cells RMC and the parity data generated through error correction encoding. The decoded data may be acquired by completing error correction for the data stored in the memory cells MC or the redundancy memory cells RMC.

For reference, since the encoded data includes the parity data, the bit numbers of the encoded data and the decoded data may be different from each other. Accordingly, the number of the plurality of buffers 560<0:N> and the plurality of data input/output lines IO<0:N> and the number of the plurality of data transfer lines DATA<0:M> may be different from each other.

In one implementation, the configurations and operations of the repair select information generation unit 530, the plurality of repair selection units 540<0:M> and the plurality of buffers 560<0:N>, row control unit 570 and a column control unit 580 are the same as those in FIG. 4. Hereinafter, explanations will be separately made for a write operation and a read operation when assuming that the repair selection unit 540<0> electrically connects the redundancy column 520 with the data transfer line DATA<0> and that the remaining repair selection units 540<1:M> electrically connect the columns 510<1:M> with the corresponding data transfer lines DATA<1:M>.

(1) A Write Operation of the Semiconductor Device

As the semiconductor device is powered on, the repair select information generation unit 530 generates the plurality of repair select information RSIA<0:M> and RSIB<0:M> based on the stored fail address FADD. Each of the plurality of repair selection units 540<0:M> electrically connects a corresponding column or the redundancy column 520 with a corresponding data transfer line, in response to the corresponding repair select information RSIA<0:M> or the corresponding repair select information RSIB<0:M>.

A write command, the row address RADD, the column address CADD and data to write are inputted to the semiconductor device. The write command, the row address RADD, the column address CADD and the data to write may be inputted at the same time or may be inputted in a predetermined sequence according to a design. The column control unit 580 updates the data of a buffer corresponding to the column address CADD among the plurality of buffers 560<0:N>. The error correction unit 550 receives the data from the plurality of buffers 560<0:N>, generates encoded data by performing error correction encoding, and transfers the encoded data to the plurality of data transfer lines DATA<0:M>. The data are transferred to the plurality of columns 510<1:M> and the redundancy column 520 from the plurality of data transfer lines DATA<0:M>. The row control unit 570 activates a word line WL corresponding to the row address RADD, and write circuits WTC provides current to the memory cells MC and the redundancy memory cell RMC which are connected to the activated word line WL and write data therein.

(2) A Read Operation of the Semiconductor Device

As the semiconductor device is powered on, the repair select information generation unit 530 generates the plurality of repair select information RSIA<0:M> and RSIB<0:M> based on the stored fail address FADD. Each of the plurality of repair selection units 540<0:M> electrically connects a corresponding column or the redundancy column 520 with a corresponding data transfer line, in response to the corresponding repair select information RSIA<0:M> or the corresponding repair select information RSIB<0:M>.

A read command, the row address RADD and the column address CADD are inputted to the semiconductor device. The read command, the row address RADD and the column address CADD may be inputted at the same time or may be inputted in a predetermined sequence according to a design. The row control unit 570 activates a word line WL corresponding to the row address RADD. Read circuits RDC read the data stored in the memory cells MC and the redundancy memory cell RMC which are connected to the activated word line WL. The data read from the plurality of columns 510<1:M> and the redundancy column 520 are transferred to the plurality of data transfer lines DATA<0:M>. The error correction unit 550 receives the data from the plurality of data transfer lines DATA<0:M>, generates decoded data by performing error correction decoding, and stores the decoded data in the plurality of buffers 560<0:N>.

Since the data of a column which has failed and needs to be replaced is not transferred to the plurality of data transfer lines DATA<0:M>, the error correction unit 550 may perform the error correction decoding on the inputted data even without the need to know the column address CADD of the inputted data. Namely, error correction decoding may be performed even when the column address CADD is not inputted or even before the column address CADD is inputted.

The column control unit 580 selects a buffer corresponding to the column address CADD among the plurality of buffers 560<0:N> and outputs the data stored in the stored buffer to an outside of the semiconductor device through the corresponding data input/output lines IO<0:N>.

In the semiconductor device, data transfer lines are electrically connected with corresponding columns or the redundancy column depending on the corresponding columns have a fail address. Through the connections between the data lines and the corresponding columns or the redundancy column, data are read from or written in the corresponding columns or the redundancy column through a read or write operation. As compared with the semiconductor device of FIG. 3, since it is not necessary to compare a column address and a fail address for a repair operation, a repair operation can be done quickly and thus, a speed of a read or write operation can increase.

Figure 6:
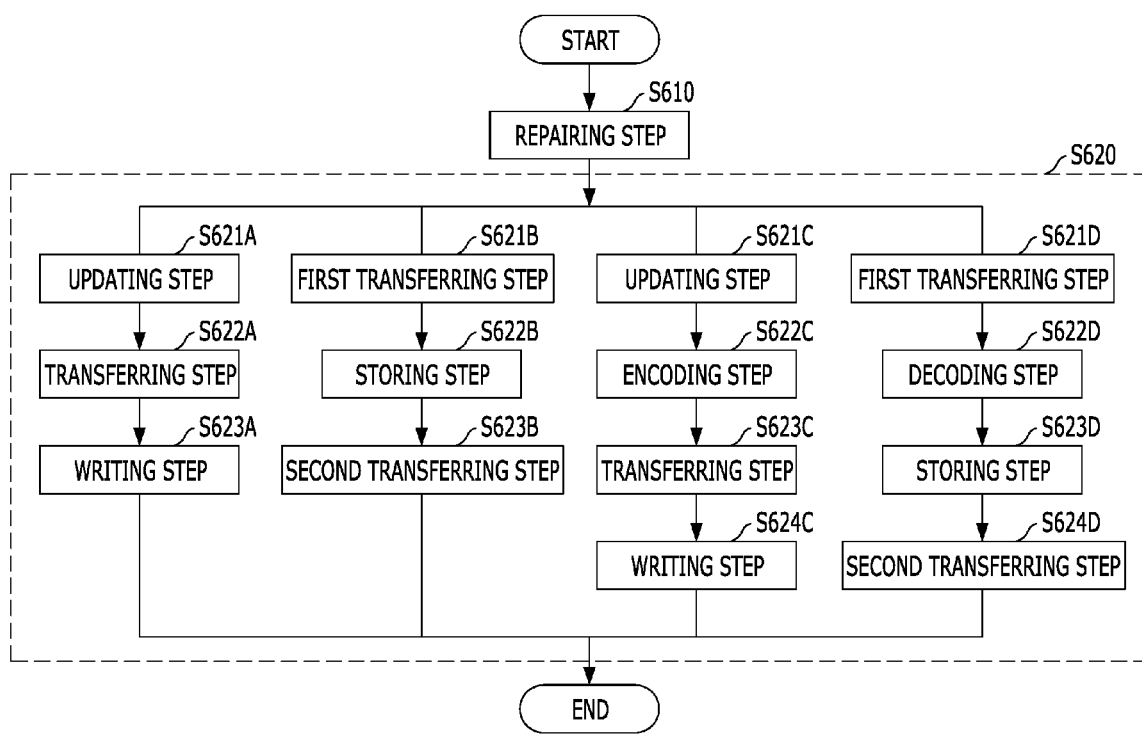
FIG. 6 shows an example of a flow chart explaining a method for operating a semiconductor device.

FIG. 6 shows an example of a flow chart explaining a method for operating a semiconductor device. In one implementation, the method for operating a semiconductor device shown in FIG. 6 may be applied for operating the semiconductor device of FIG. 4 or 5. For example, the semiconductor device may include a plurality of data transfer lines DATA<0:M>, a plurality of columns 410<0:M> or 510<0:M> including a plurality of memory cells MC, and at least one redundancy column 420 or 520 including a plurality of redundancy memory cells RMC.

Referring to FIG. 6, a method for operating a semiconductor device includes a repairing step S610 and an accessing step S620 includes electrically connecting each of the plurality of data transfer lines DATA<0:M> with a column selected among the plurality of columns 410<0:M> or 510<0:M> and at least one redundancy column 420 or 520, in response to an address FADD of at least one column to be replaced among the plurality of columns 410<0:M> or 510<0:M> (hereinafter, referred to as 'repairing step S610'), and accessing data to memory cells included in columns which are electrically connected with the plurality of data transfer lines DATA<0:M>, among the plurality of columns 410<0:M> or 510<0:M> and the at least one redundancy column 420 or 520 (hereinafter, referred to as 'accessing step S620').

In the repairing step S610, a repair select information generation unit 430 or 530 of a semiconductor device generates a plurality of repair select information RSIA<0:

M> or repair select information RSIB<0:M> based on a fail address FADD. Each of a plurality of repair selection units 440<0:M> or 540<0:M> electrically connects a corresponding column or the redundancy column 420 or 520 with a corresponding data transfer line in response to the corresponding repair select information RSIA<0:M> or RSIB<0:M>.

In the accessing step S620, data of memory cells included in selected columns among the plurality of columns 410<0:M> or 510<0:M> and the at least one redundancy column 420 or 520 are accessed by the corresponding data transfer lines DATA<0:M> to perform a write operation or a read operation. The write operation and the read operation may include or may not include an error correcting operation.

In the case where the semiconductor device performs the write operation without an error correcting operation, the accessing step S620 includes an updating step S621A, a transferring step S622A and a writing step S623A. At step S621A, data stored in a buffer selected by a column address CADD among the plurality of buffers 450<0:M> is updated with data transferred from the data input/output lines IO<0:M>. At step S622A, data stored in the plurality of buffers 450<0:M> are transferred to the plurality of data transfer lines DATA<0:M>. At step S623A, data of the plurality of data transfer lines DATA<0:M> are written to memory cells which are connected to a word line selected by a row address RADD among a plurality of word lines WL.

In the case where the semiconductor device performs the read operation i without an error correcting operation, the accessing step S620 includes a first transferring step S621B, a storing step S622B and a second transferring step S623B. At step S621B, data of memory cells which are connected to a word line selected by a row address RADD among the plurality of word lines WL are transferred to the plurality of data transfer lines DATA<0:M>. At step S622B, data of the plurality of data transfer lines DATA<0:M> are stored in the plurality of buffers 450<0:M>. At step S623B, data stored in a buffer selected by a column address CADD among the plurality of buffers 450<0:M> are transferred to the data input/output lines IO<0:M>( ).

In the case where the semiconductor device performs the write operation including an error correcting operation, the accessing step S620 includes an updating step S621C, an encoding step S622C, a transferring step S623C, and a writing step S624C. At step S621C, data stored in a buffer selected by a column address CADD among the plurality of buffers 560<0:N> are updated with data from the data input/output lines IO<0:N>( ) At step S622C, an error correction encoding is performed for data stored in the plurality of buffers 560<0:N> to generate encoded data( ). At step S623C, the encoded data are transferred to the plurality of data transfer lines DATA<0:M>( ). At step S624C, data of the plurality of data transfer lines DATA<0:M> are written to memory cells which are connected to a word line selected by a row address RADD among a plurality of word lines WL.

In the case where the semiconductor device performs the read operation including an error correcting operation, the accessing step S620 includes a first transferring step S621D, a decoding step S622D, a storing step S623D and a second transferring step S624D. At step S621D, data of memory cells which are connected to a word line selected by a row address RADD among the plurality of word lines WL are transferred to the plurality of data transfer lines DATA<0:M>. At step S622D, an error correction decoding is performed for data of the plurality of data transfer lines DATA<0:M> to generate decoded data. At step S623D, the decoded data are stored in the plurality of buffers 560<0:N>. At step S624D, data stored in a buffer selected by a column address CADD among the plurality of buffers 560<0:N> are transferred to the data input/output lines IO<0:N>( ).

According to the method for operating a semiconductor device, the speed of a write operation and a read operation can increase.

The above and other memory circuits or semiconductor devices based on the disclosed technology can be used in a range of devices or systems. FIGS. 7-11 provide some examples of devices or systems that can implement the memory circuits disclosed herein.

Figure 7:
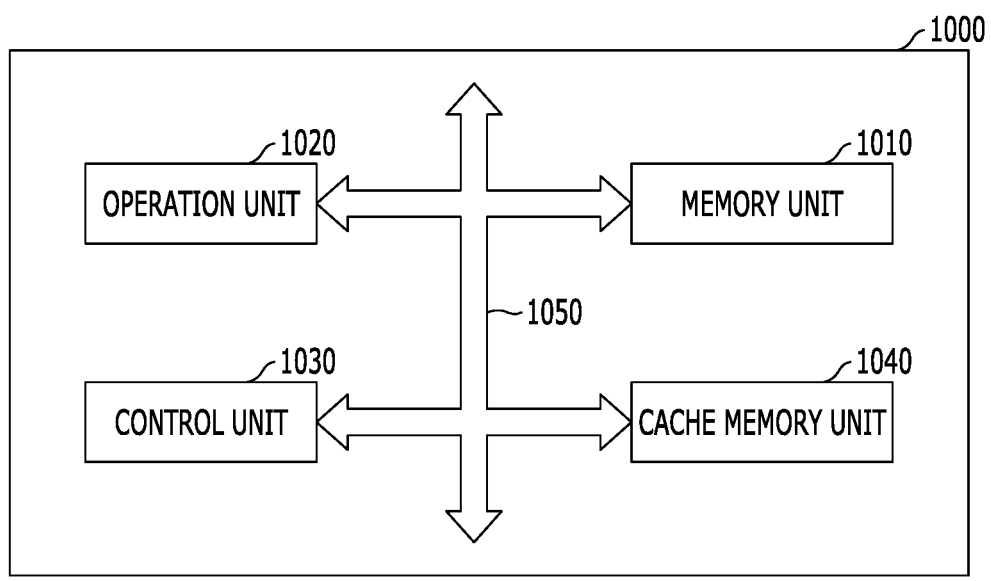
FIG. 7 shows an example of a configuration diagram of a microprocessor implementing memory circuitry based on the disclosed technology.

FIG. 7 shows an example of a configuration diagram of a microprocessor based on another implementation of the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and an address where data for performing of the operations are stored.

The memory unit 1010 may include one or more of the above-described semiconductor devices in accordance with the implementations. For example, the memory unit 1010 implementation may include a plurality of columns including a plurality of memory cells; at least one redundancy column including a plurality of redundancy memory cells and configured to replace at least one column among the plurality of columns; a repair select information generation unit configured to store a column address of the at least one column to be replaced among the plurality of columns and generate a plurality of repair select information in response to the stored column address; and a plurality of repair selection units connected with data transfer lines corresponding to them among the plurality of data transfer lines, columns corresponding to them among the plurality of columns and the at least one redundancy column, and each configured to electrically connect a column selected among a column corresponding to it and the at least one redundancy column, to a data transfer line corresponding to it, in response to repair select information corresponding to it among the plurality of repair select information. Through this, a time required to perform a repair operation of the memory unit 1010 can be saved, the speed of a write or read operation of the memory unit 1010 can increase. Consequently, speed and performance of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands and controlling input and output of signals of the microprocessor, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
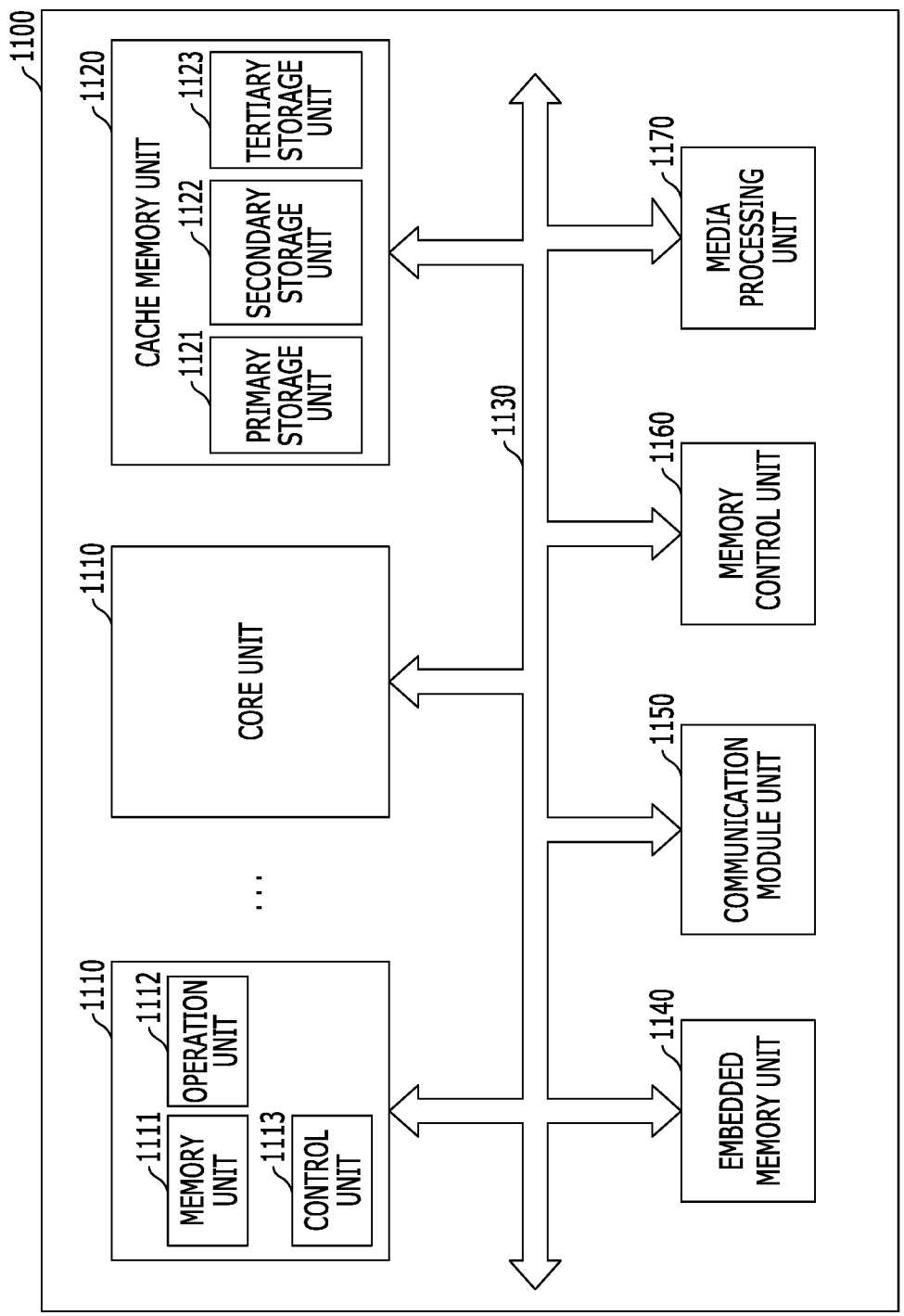
FIG. 8 shows an example of a configuration diagram of a processor implementing memory circuitry based on the disclosed technology.
Figure 9:
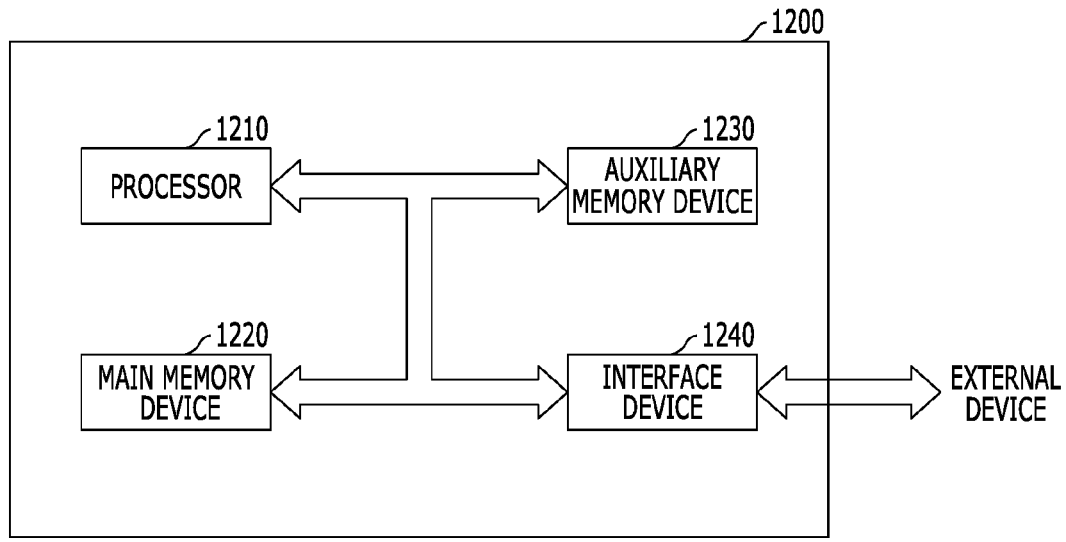
FIG. 9 shows an example of a configuration diagram of a system implementing memory circuitry based on the disclosed technology.

FIG. 8 is a configuration diagram of a processor based on another implementation of the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and an address where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage unit 1121, a secondary storage unit 1122 and a tertiary storage unit 1123. In general, the cache memory unit 1120 includes the primary and secondary storage units 1121 and 1122, and may include the tertiary storage unit 1123 in the case where high storage capacity is required. As the occasion demands, the cache memory unit 1120 may include an increased number of storage units. That is to say, the number of storage units which are included in the cache memory unit 1120 may be changed according to a design. The speeds at which the primary, secondary and tertiary storage units 1121, 1122 and 1123 store and discriminate data may be the same or different. In the case where the speeds of the respective storage units 1121, 1122 and 1123 are different, the speed of the primary storage unit 1121 may be largest. At least one storage unit of the primary storage unit 1121, the secondary storage unit 1122 and the tertiary storage unit 1123 of the cache memory unit 1120 may include one or more of the above-described semiconductor devices in accordance with the implementations. For example, the cache memory unit 1120 implementation may include a plurality of columns including a plurality of memory cells; at least one redundancy column including a plurality of redundancy memory cells and configured to replace at least one column among the plurality of columns; a repair select information generation unit configured to store a column address of the at least one column to be replaced among the plurality of columns and generate a plurality of repair select information in response to the stored column address; and a plurality of repair selection units connected with data transfer lines corresponding to them among the plurality of data transfer lines, columns corresponding to them among the plurality of columns and the at least one redundancy column, and each configured to electrically connect a column selected among a column corresponding to it and the at least one redundancy column, to a data transfer line corresponding to it, in response to repair select information corresponding to it among the plurality of repair select information. Through this, a time required to perform a repair operation of the cache memory unit 1120 can be saved, the speed of a write or read operation of the cache memory unit 1120 can increase. Consequently, speed and performance of the processor 1100 may be improved.

Although it was shown in FIG. 8 that all the primary, secondary and tertiary storage units 1121, 1122 and 1123 are configured inside the cache memory unit 1120, it is to be noted that all the primary, secondary and tertiary storage units 1121, 1122 and 1123 of the cache memory unit 1120 may be configured outside the core unit 1110 and may compensate for a difference in data processing speed between the core unit 1110 and the external device. Meanwhile, it is to be noted that the primary storage unit 1121 of the cache memory unit 1120 may be disposed inside the core unit 1110 and the secondary storage unit 1122 and the tertiary storage unit 1123 may be configured outside the core unit 1110 to strengthen the function of compensating for a difference in data processing speed. In another implementation, the primary and secondary storage units 1121, 1122 may be disposed inside the core units 1110 and tertiary storage units 1123 may be disposed outside core units 1110. The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage unit 1121 of the cache memory unit 1120 may be configured in each core unit 1110 in correspondence to the number of the plurality of core units 1110, and the secondary storage unit 1122 and the tertiary storage unit 1123 may be configured outside the plurality of core units 1110 in such a way as to be shared through the bus interface 1130. The processing speed of the primary storage unit 1121 may be larger than the processing speeds of the secondary and tertiary storage unit 1122 and 1123. In another implementation, the primary storage unit 1121 and the secondary storage unit 1122 may be configured in each core unit 1110 in correspondence to the number of the plurality of core units 1110, and the tertiary storage unit 1123 may be configured outside the plurality of core units 1110 in such a way as to be shared through the bus interface 1130. The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data prepared in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory) and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MIVIC), an embedded MIVIC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 11:
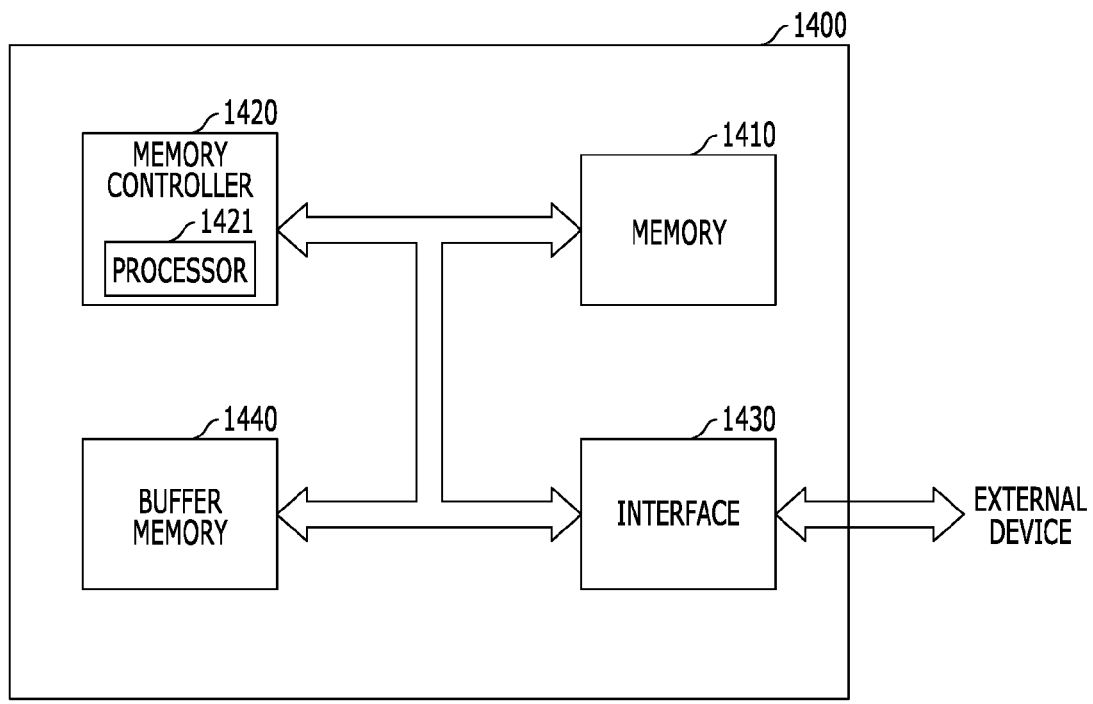
FIG. 11 shows an example of a configuration diagram of a memory system implementing memory circuitry based on the disclosed technology.

FIG. 11 is a configuration diagram of a system based on another implementation of the disclosed technology.

Referring to FIG. 11, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 decodes inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 implementation may include a plurality of columns including a plurality of memory cells; at least one redundancy column including a plurality of redundancy memory cells and configured to replace at least one column among the plurality of columns; a repair select information generation unit configured to store a column address of the at least one column to be replaced among the plurality of columns and generate a plurality of repair select information in response to the stored column address; and a plurality of repair selection units connected with data transfer lines corresponding to them among the plurality of data transfer lines, columns corresponding to them among the plurality of columns and the at least one redundancy column, and each configured to electrically connect a column selected among a column corresponding to it and the at least one redundancy column, to a data transfer line corresponding to it, in response to repair select information corresponding to it among the plurality of repair select information. Through this, a time required to perform a repair operation of the main memory device 1220 can be saved, the speed of a write or read operation of the main memory device 1220 can increase. Consequently, speed and performance of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 implementation may include a plurality of columns including a plurality of memory cells; at least one redundancy column including a plurality of redundancy memory cells and configured to replace at least one column among the plurality of columns; a repair select information generation unit configured to store a column address of the at least one column to be replaced among the plurality of columns and generate a plurality of repair select information in response to the stored column address; and a plurality of repair selection units connected with data transfer lines corresponding to them among the plurality of data transfer lines, columns corresponding to them among the plurality of columns and the at least one redundancy column, and each configured to electrically connect a column selected among a column corresponding to it and the at least one redundancy column, to a data transfer line corresponding to it, in response to repair select information corresponding to it among the plurality of repair select information. Through this, a time required to perform a repair operation of the auxiliary memory device 1230 can be saved, the speed of a write or read operation of the auxiliary memory device 1230 can increase. Consequently, speed and performance of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MIVIC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device and so on. The communication device may include a module capable of being connected with a wired network, a module capable of being connected with a wireless network and both of them.

The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
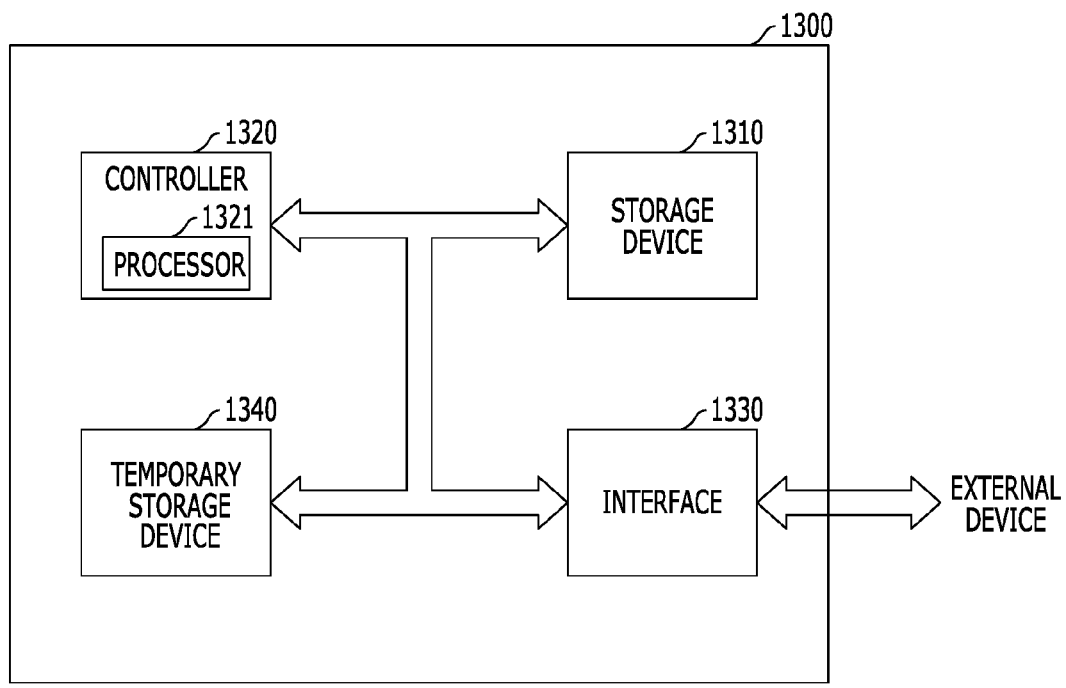
FIG. 10 shows an example of a configuration diagram of a data storage system implementing memory circuitry based on the disclosed technology.

FIG. 10 is a configuration diagram of a data storage system based on another implementation of the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC)

card, a memory stick card, a smart media (SM) card, a multimedia card (MMC), an embedded MIVIC (eMMC), a compact flash (CF) card, and so on, or be compatible with interfaces which are used in devices similar to the above mentioned devices.

In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other. The temporary storage device 1340 can store data temporarily implementation for efficiently transferring data between the interface 1330 and the storage device 1310 according to diversifications and high performance of an interface with an external device, a controller and a system. For example, the temporary storage device 1340 implementation for temporarily storing data may include a plurality of columns including a plurality of memory cells; at least one redundancy column including a plurality of redundancy memory cells and configured to replace at least one column among the plurality of columns; a repair select information generation unit configured to store a column address of the at least one column to be replaced among the plurality of columns and generate a plurality of repair select information in response to the stored column address; and a plurality of repair selection units connected with data transfer lines corresponding to them among the plurality of data transfer lines, columns corresponding to them among the plurality of columns and the at least one redundancy column, and each configured to electrically connect a column selected among a column corresponding to it and the at least one redundancy column, to a data transfer line corresponding to it, in response to repair select information corresponding to it among the plurality of repair select information. Through this, a time required to perform a repair operation of the temporary storage device 1340 can be saved, the speed of a write or read operation of the temporary storage device 1340 can increase. Consequently, speed and performance of the data storage system 1300 may be improved.

FIG. 11 is a configuration diagram of a memory system based on another implementation of the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 implementation may include a plurality of columns including a plurality of memory cells; at least one redundancy column including a plurality of redundancy memory cells and configured to replace at least one column among the plurality of columns; a repair select information generation unit configured to store a column address of the at least one column to be replaced among the plurality of columns and generate a plurality of repair select information in response to the stored column address; and a plurality of repair selection units connected with data transfer lines corresponding to them among the plurality of data transfer lines, columns corresponding to them among the plurality of columns and the at least one redundancy column, and each configured to electrically connect a column selected among a column corresponding to it and the at least one redundancy column, to a data transfer line corresponding to it, in response to repair select information corresponding to it among the plurality of repair select information. Through this, a time required to perform a repair operation of the memory 1410 is shortened, the speed of a write/read operation of the memory 1410 may be increased. Consequently, speed and performance of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include a plurality of columns including a plurality of memory cells; at least one redundancy column including a plurality of redundancy memory cells and configured to replace at least one column among the plurality of columns; a repair select information generation unit configured to store a column address of the at least one column to be replaced among the plurality of columns and generate a plurality of repair select information in response to the stored column address; and a plurality of repair selection units connected with data transfer lines corresponding to them among the plurality of data transfer lines, columns corresponding to them among the plurality of columns and the at least one redundancy column, and each configured to electrically connect a column selected among a column corresponding to it and the at least one redundancy column, to a data transfer line corresponding to it, in response to repair select information corresponding to it among the plurality of repair select information. Through this, a time required to perform a repair operation of the buffer memory 1440 is shortened, the speed of a write/read operation of the buffer memory 1440 may be increased. Consequently, speed and performance of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 7-11 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular implementations of particular inventions. Certain features that are described in this patent document in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the implementations described in this patent document should not be understood as requiring such separation in all implementations.

Only a few implementations and examples are described. Other implementations, enhancements and variations can be made based on what is described and illustrated.

What is claimed is:

1. An electronic device comprising a semiconductor memory unit that includes:
   a plurality of data transfer lines;
   a plurality of columns respectively corresponding to the plurality of data transfer lines in one-to-one correspondence;
   one or more redundancy columns;
   a plurality of first switches, each selectively providing an electrical connection between one of the plurality of data transfer lines and a corresponding one of the plurality of columns; and
   a plurality of second switches, each selectively providing an electrical connection between one of the plurality of data transfer lines and the one or more redundancy columns.

2. The electronic device according to claim 1, wherein each of the plurality of columns is connected to either a corresponding first switch or a corresponding second switch.

3. The electronic device according to claim 1, further comprising:
   a fail address storing unit storing information of a particular column among the plurality of columns; and
   a repair select information generation unit configured to generate a plurality of first repair select signals applied respectively to the plurality of first switches and a plurality of second repair select signals applied respectively to the plurality of second switches, respectively.

4. The electronic device according to claim 3, wherein the plurality of first repair selection signals cause the particular column not to be connected to a corresponding first switch.

5. The electronic device according to claim 4, wherein the plurality of second selection signals cause the particular column to be connected to a corresponding second switch.

6. The electronic device according to claim 1, wherein each of the plurality of columns includes memory cells, respectively, and
   wherein each of the one or more redundancy columns includes redundancy memory cells.

7. The electronic device according to claim 1, further comprising:
   a plurality of data input/output lines receiving data to be stored in a selected column from an outside or outputting data read from a selected column to an outside.

8. The electronic device according to claim 1, further comprising:
   a plurality of buffers coupled to the plurality of data transfer lines, respectively, and operable to buffer input data to the columns and to buffer data from the columns.

9. The electronic device according to claim 6,
   wherein each of the memory cells and each of the redundancy memory cells comprises:
   a select transistor connected to a corresponding memory cell; and
   a variable resistance element of which resistance value is determined according to a value of data stored therein.

10. The electronic device according to claim 1, further comprising:
    an error correction unit correcting errors that occur in a write or read operation.

11. The electronic device according to claim 9, wherein the error correction unit receives data from the plurality of data transfer lines and performs error correction decoding to generate decoded data.

12. The electronic device according to claim 9, wherein the error correction unit receives data transferred from outside and performs error correction encoding to generate encoded data.

13. The electronic device according to claim 6, wherein each column includes:
 a source line and a bit line that are connected to both ends of the memory cells;
 a write circuit providing current to a selected memory circuit in a write operation; and
 a read circuit providing current to a selected memory circuit in a read operation.

14. An electronic device comprising a semiconductor memory unit that includes:
 columns arranged relative to one another, each column including memory cells;
 a redundancy column arranged relative to the columns and including redundancy memory cells and operable to replace a particular column among the columns;
 data transfer lines respectively corresponding to the columns in one-to-one correspondence, each data transfer line connectable to the redundancy column; and
 a control circuit coupled to columns and the redundancy columns and operable to control electrical coupling between the data transfer lines and the columns and the redundancy column to allow for replacing one of the columns by the redundancy column.

15. The electronic device according to claim 14, wherein the particular column is electrically connected to the redundancy column.

16. The electronic device according to claim 14, further comprising:
 a fail address storing unit storing information of the particular column; and
 a repair select information generation unit configured to generate signals to provide the electrical connections between the data transfer lines and the columns or the redundancy column.

17. The electronic device according to claim 14, wherein each of the memory cells and each of the redundancy memory cells includes:
 a select transistor connected to a corresponding memory cell; and
 a variable resistance element of which resistance value is determined according to a value of data stored therein.

18. The electronic device according to claim 14, wherein each column includes:
 a source line and a bit line that are connected to both ends of the memory cells;
 a write circuit providing current to a selected memory circuit in a write operation; and
 a read circuit providing current to a selected memory circuit in a read operation.

19. The electronic device according to claim 14, further comprising:
 data input/output lines receiving data to be stored in a selected memory cell from an outside or outputting data read from a selected memory cell to an outside.

20. The electronic device according to claim 14, further comprising:
 an error correction unit electrically connected to the data transfer lines and configured to correct errors that occur in a write or read operation.

* * * * *